(12) United States Patent
Costello et al.

(10) Patent No.: US 7,363,186 B1
(45) Date of Patent: Apr. 22, 2008

(54) APPARATUS AND METHOD FOR SELF CALIBRATION OF CURRENT FEEDBACK

(75) Inventors: Scott M. Costello, Trenton, MI (US);
Akio Fujimaki, Ypsilanti, MI (US);
John A. Janitz, Plymouth, MI (US);
Cristian R. Ludwig, Westland, MI (US); Robert D. Mills, South Lyon, MI (US); Allen L. Youngpeter, Canton, MI (US)

(73) Assignee: Kelsey-Haynes Company, Livonia, MI (US)

( * ) Notice: Subject to any disclaimer, the term of this patent is extended or adjusted under 35 U.S.C. 154(b) by 0 days.

(21) Appl. No.: 11/644,068

(22) Filed: Dec. 22, 2006

(51) Int. Cl.
*G01R 35/00* (2006.01)
(52) U.S. Cl. .................... 702/107; 702/57; 702/64; 702/65; 702/94; 702/117; 701/41; 701/44

(58) Field of Classification Search ............... 702/57, 702/64, 65, 107, 117–120, 94, 95, 105; 324/546, 324/158.1, 601; 701/41–44, 70–92; 327/120, 327/416
See application file for complete search history.

(56) References Cited

U.S. PATENT DOCUMENTS

| | | | |
|---|---|---|---|
| 4,794,247 A * | 12/1988 | Stineman, Jr. .......... | 250/214 A |
| 6,166,670 A * | 12/2000 | O'Shaughnessy ........... | 341/136 |
| 6,331,830 B1 * | 12/2001 | Song et al. ................. | 341/121 |
| 6,583,740 B2 * | 6/2003 | Schofield et al. ........... | 341/120 |
| 6,943,540 B2 * | 9/2005 | Vincent et al. .......... | 324/158.1 |

FOREIGN PATENT DOCUMENTS

WO   WO 02/33823 A1   4/2002

* cited by examiner

*Primary Examiner*—Hal Wachsman
*Assistant Examiner*—Phuong Huynh
(74) *Attorney, Agent, or Firm*—MacMillan, Sobanski & Todd, LLC

(57) ABSTRACT

The current drawn by a precision resistor that is selectively connected across a load is utilized to calibrate a current sensed by current sensing device that is connected in series with the load.

17 Claims, 5 Drawing Sheets

United States Patent US 7,363,186 B1

APPARATUS AND METHOD FOR SELF CALIBRATION OF CURRENT FEEDBACK

CROSS-REFERENCE TO RELATED APPLICATIONS

Not Applicable

BACKGROUND OF THE INVENTION

This invention relates in general to control systems and in particular to an apparatus and method for self-calibration of a current feedback signal and a subsequent command signal within a control system.

Motor vehicles are becoming increasingly sophisticated, especially with regard to electronic controllers for various onboard systems. The electrical to mechanical interfaces for many of these systems include a coil that is used to displace a mechanical device, such as a valve armature with the displacement of the armature being a function of the current flowing through the valve. Several examples include solenoid valves that control vehicle brakes in Anti-Lock Brake, Traction Control and Vehicle Stability Control Systems, solenoid valves that control torsion rods in Active Suspensions Systems and coils that control steering assist in Electro-Hydraulic Steering Systems. Additionally, variable currents are used to drive solenoids, DC motors, and other inductive loads in many automotive subsystems. Furthermore, the position of linear solenoids and the torque in DC motors are directly correlated to the current drive, which require accurate current measurements for precise positioning.

There is shown in FIG. 1, a typical prior art vehicle control system 10 that utilizes a switch 12 to control the flow of electric current through a load 14. As shown in FIG. 1, the load 14 is connected between a first side of the switch 12 and a power supply V+. A second side of the switch 12 is connected to ground to provide short circuit protection to the power supply should the switch fail. As also shown in FIG. 1, a controller 16 is connected to the switch 12 that is operative to open and close the switch. The controller 16 typically includes a microprocessor with a memory that stores an operating algorithm. The controller 16 also is usually connected to one or more sensors that monitor operating parameters of the vehicle. The microprocessor, in accordance with the operating algorithm, is responsive to the sensor signals to selectively open and close the switch 12 to activate and deactivate the load 14.

As described above, the load 14 is often a coil 20, as shown in FIG. 2. Additionally, the switch 12 is usually a semi-conductor device, such as a Field Effect Transistor (FET) 22 having a drain connected to one end of the coil 20 and a source connected to ground. Again, the other end of the coil 20 is connected to the power supply V+. The gate of the FET 22 is usually connected to a control port of an Electronic Control Unit (ECU) 24 which functions as the controller 16 described above. Typically, the ECU control port will be either "low" at ground potential or "high" at a fixed voltage, such as five volts. When the control port is low, the FET 22 is in a non-conducting state and blocks current flow through the coil 20 while, when the control port is high, the FET is in a conducting state, allowing a potentially high current to flow through the coil.

In order to provide closed loop control of a system feedback is required. For the load 20 shown in FIG. 2, feedback of the actual current flowing though the coil is required to confirm that the control is attaining the desired current. Devices for providing current feedback in a high current circuit are typically called current shunts, which can come in many forms including metal bars, resistors or semi-conductor devices. A resistive shunt would be connected between the inductive load 20 and the switch 22 (not shown). The current could then be measured by measuring the differential voltage across the shunt and applying Ohm's Law to convert the voltage into a current. This is the common method to measure the current through a solenoid coil or DC motor. The disadvantage of using such devices is that they can be expensive, require a large amount of space and need a means of dissipating any heat created by the flowing current.

Recently, inexpensive integrated FET chips, which include internal circuitry that provides a current feedback signal have been developed. This feature is typically referred to as "diagnostic feedback,". "current sense output," or "mirror FET." Such integrated FET's are referred to as "feedback-FET's" in the following. A feedback-FET 32 is shown if FIG. 3, where components that are the similar to components shown in FIG. 2 have the same numerical designators. In FIG. 3, when the feedback-FET 32 is in its conductive state, a voltage that is proportional to the current flowing between the drain and source of the FET 32 is generated at a current feedback terminal 34 on the FET. The current feedback terminal 34 is connected by a current feedback line 36 to a corresponding current feedback port 38 on the ECU 24.

As described above, feedback-FETs are not the only means of attaining current feedback for a circuit; however, the discussion from here forward will use a feedback-FET device in the descriptions and claims.

In some applications, multiple loads are supplied with power from a single FET, but controlled with individual control FET's with one of the control FET's associated with each of the loads. This may occur, for example, when a plurality of solenoid coils are used to control the application of hydraulic pressure in a vehicle electronic brake system, such as an Anti-Lock Brake System, a Traction Control System and/or a Vehicle Stability Control System. Other applications may include control of multiple fuel injectors in an engine control system and control of solenoid valves in active suspension systems and electrically assisted power steering systems.

A typical multiple load control application is shown in FIG. 4, where components that are similar to components shown in the preceding figures have the same numerical identifiers. As shown in FIG. 4, a high end of each of a plurality of loads, shown as coils, $L_1$ though $L_n$, is each connected to the source terminal of a feedback-FET 32. The feedback-FET drain terminal is connected a power supply V+while the feedback-FET gate is connected to the ECU 24. The feedback-FET 32 also has a current feedback terminal 34 that is connected by a current feedback line 36 to a corresponding current feedback port 38 on the ECU 24. As also shown in FIG. 4, a low end of each of the loads, $L_1$ though $L_n$, is connected to a drain terminal of an associated control, or driver, FET, $T_1$ through $T_n$. The source terminal of each of the control FET's is connected to ground, while the gate of each of the driver FET's is connected to the ECU 24.

During operation of the control circuit shown in FIG. 4, the feedback-FET 32 is placed into its conducting state to provide power to each of the loads $L_1$ through $L_n$. Each load is then individually energized by selectively placing the corresponding driver FET $T_1$ through $T_n$ into its conducting state. Often, only one load will be activated at a time, in which case the current sensed by the feedback-FET 32 will be the same as the load current. Thus, the use of a single feedback-FET 32 allows monitoring a plurality of loads while minimizing component costs.

While the use of a feedback-FET 32 can provide useful feedback information to an ECU 24, the particular application may require a high level of accuracy for the information. Unfortunately, the built-in amplifier in these devices may not provide the needed level of accuracy for a particular application. Accordingly, it would be useful to provide a self-calibrating capability for a feedback-FET.

BRIEF SUMMARY OF THE INVENTION

This invention relates to an apparatus and method for self-calibration of a current feedback signal and using the feedback to enhance control of the current. Ultimately this allows the use of less expensive but also less accurate high power devices while maintaining precision feedback via inexpensive low current devices.

The present invention contemplates a self calibrating control circuit that includes load connected in series with a current sensing device. The circuit also includes a high precision load device having known characteristics, the device being selectively connected across the load. The circuit further includes a calibration device connected to the current sensing device and the high precision load. The calibration device is operative to monitor an output voltage of a power supply connected to the load and to measure a first load current flowing through the load without the high precision load device connected across the load. The calibration device is further operative to connect the high precision load device across the load and to measure a second load current flowing though the load. The calibration device is also operative to determine an actual load current as a function of the first and second load currents and the known characteristics of the high-precision load device and the power supply voltage.

The present invention also contemplates a method for calibrating a load current that includes providing a high precision load device that may be selectively connected across a load and measuring a first load current without the high precision load device connected across the load. The method then connects the high precision load device across the load and determines an expected calibration current flowing through the high precision load device as a function of known characteristics of the high precision load device and the voltage of a power supply that is electrically connected to the load. The method also measures a second load current with the high precision load device connected across the load. The method concludes by determining an actual load current as a function of the first and second load currents and the expected calibration current.

The present invention further contemplates determining a true load impedance by scaling an assumed load impedance by a ratio of the first load current to the actual load current. The present invention also contemplates determining at lease one control command in a control system as a function of the true load impedance as found by the scaling described in the preceding sentence.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
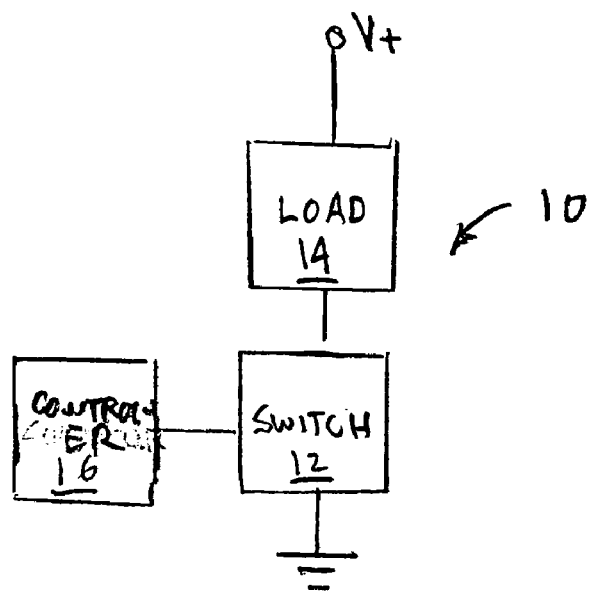
FIG. 1 is a schematic diagram of a typical prior art control circuit.
Figure 2:
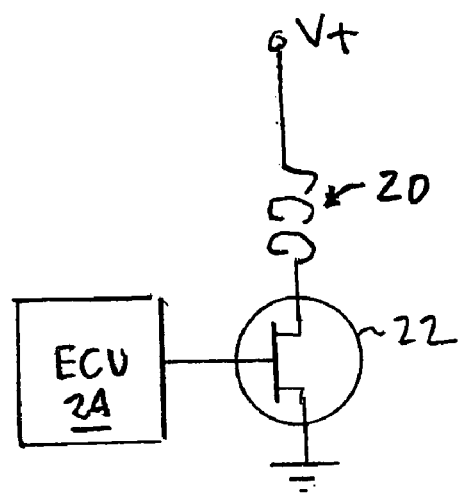
FIG. 2 is a schematic diagram of an embodiment of the prior art control circuit shown in FIG. 1 that utilizes a field effect transistor as an electronic switch.
Figure 3:
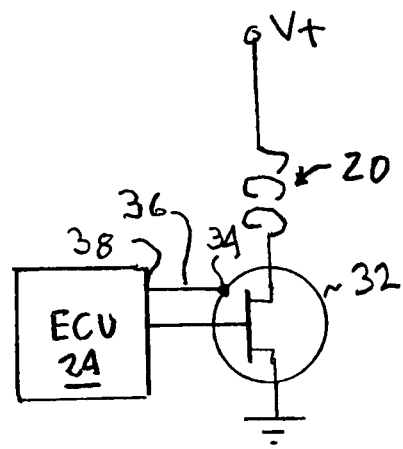
FIG. 3 is a schematic diagram of an alternate embodiment of the prior art control circuit shown in FIG. 1 that utilizes an enhanced field effect transistor with current feedback as an electronic switch.
Figure 4:
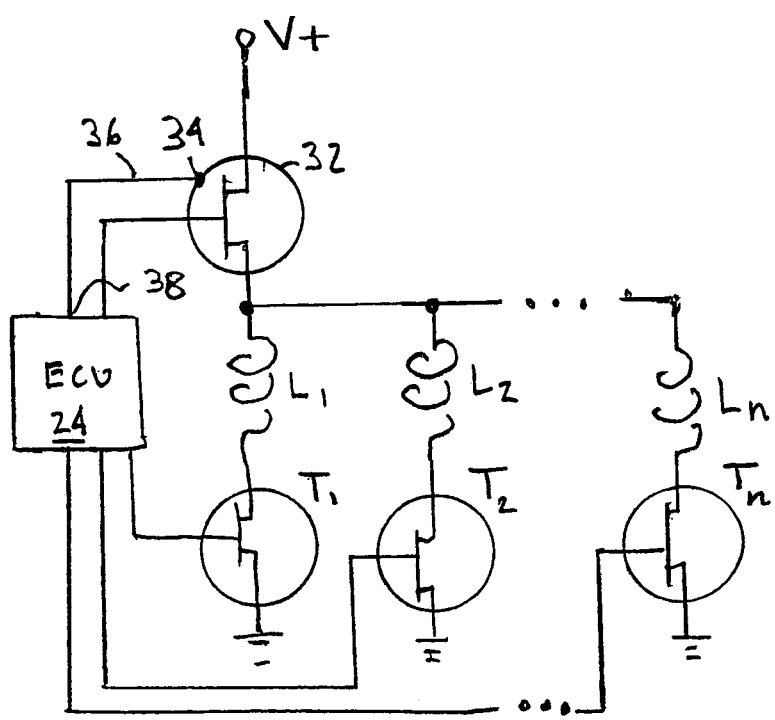
FIG. 4 is a schematic diagram of an alternate embodiment of the prior art control circuit shown in FIG. 3.
Figure 5:
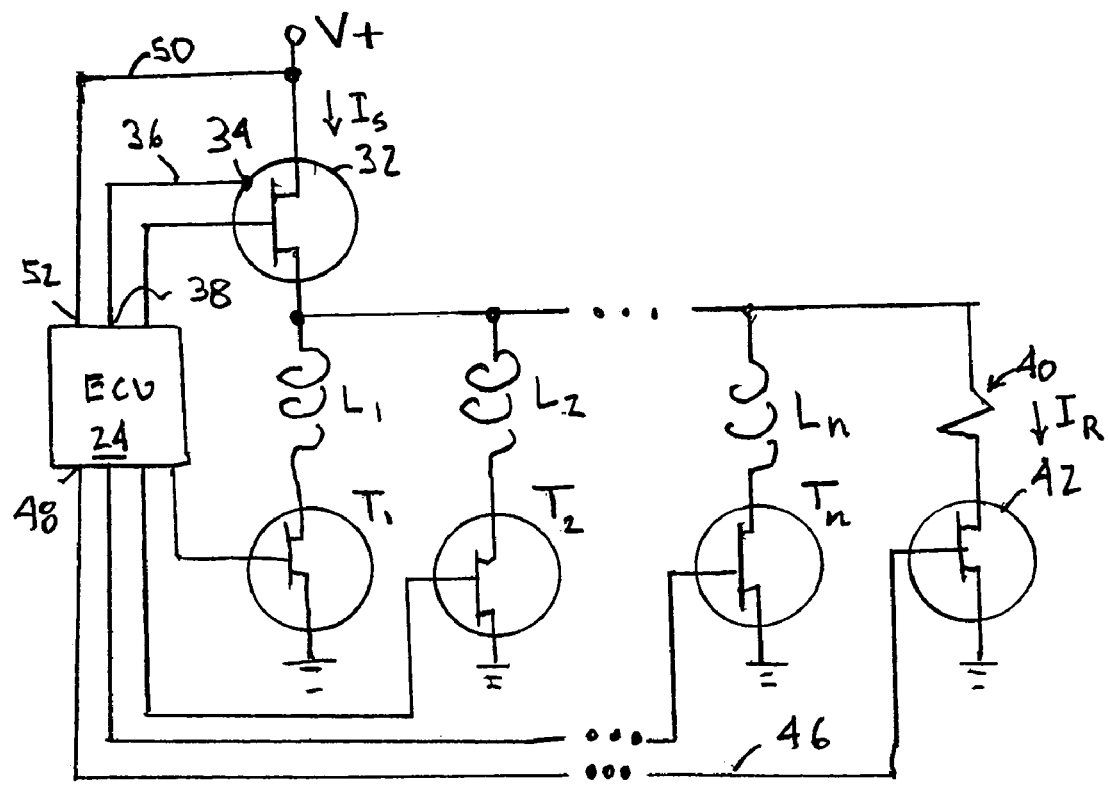
FIG. 5 is a schematic diagram of a control circuit in accordance with the present invention.

Referring now to the drawings, there is illustrated in FIG. 5 a schematic diagram of a control circuit in accordance with the present invention. Components shown in FIG. 5 that are similar to components shown in FIG. 4 have the same numerical identifiers. Thus, a plurality of loads, shown as the coils $L_1$ through $L_n$, are connected to the output terminal of a current sensing device 32, which, in the preferred embodiment, is a source terminal of a feedback-FET, as illustrated in FIG. 5. It will be appreciated that the invention also may be practiced with other current sensing devices than the feedback FET shown in the Figs. The drain of the feedback-FET 32, or input terminal of the current sensing device, is connected to a power supply V+ while the FET gate is connected to an ECU 24. A feedback-FET current feedback terminal 34 is connected by a line 36 to a current feedback port 38 on the ECU 24. With regard to the current sensing device, a similar output terminal would be connected to the ECU current feedback port 38 (not shown). A low end of each of the loads, $L_1$ though $L_n$, is connected to a drain terminal of an associated driver FET, $T_1$ through $T_n$, respectively. The source terminal of each of the driver FET's is connected to ground while the gate of each of the driver FET's is connected to the ECU 24. Thus, the ECU is operable to provide power to the loads with the feedback-FET 32 and to selectively actuate one or more of the loads by switching the driver FET associated with the particular load to its conducting state. It will be appreciated that, while the present description refers to components of the circuits being connected to an ECU 24, the control of the circuit is typically controlled by a microprocessor that is disposed within the ECU (not shown). Thus, the various electronic components are connected to and operated by the microprocessor, either directly or indirectly. The microprocessor operates in accordance with a stored control algorithm.

The present invention contemplates adding a precision calibration resistor 40 in parallel to the loads $L_1$ through $L_n$. As shown in FIG. 5, the calibration resistor 40 has a first end connected to the high side of the loads $L_1$ through $L_n$ and a second end connected to a switch, which, it the preferred embodiment, is a calibration FET 42, as shown in FIG. 5. Thus, the second end of the calibration resistor 40 is connected to the drain of the calibration FET 42. The source of the calibration FET 42 is connected to ground while the FET gate 44 is connected by a line 46 to a calibration control port 48 on the ECU 24. The microprocessor in the ECU 24 is operable to selectively insert and remove the calibration resistor 40 across the loads by switching the calibration FET 42 between its conducing and non-conducting states, respectively. Additionally, the power supply V+ is connected by a voltage sensing line 50 to a voltage sensing port 52 on the ECU 24.

The operation of the circuit shown in FIG. 5 will now be described. When the calibration FET 42 is switched to its conducting mode, the current drawn by the loads and measured by the current sensing device 32 will increase by a measurable amount attributed solely to a calibration current $I_R$ flowing through the calibration resistor 40. Since the voltage across the calibration resistor 40 is approximately equal to the voltage V of the power supply V+, as sensed at the voltage sensing port 52, and the resistive value R of the precision resistor 40 is known, the calibration current $I_R$ drawn by the precision resistor 40 can be determined by the ECU 24 as:

$$I_R = V/R. \tag{1}$$

The present invention contemplates that the calibration current $I_R$ is utilized to scale the source current, $I_S$, supplied by the power supply V+, as sensed, or measured, by the feedback-FET 32, to determine an actual value of the load current $I_L$. It will be appreciated that, because the load is connected in series with the power supply, the sensed source current is also a sensed load current and accordingly the current flowing through the current sensing device to the load may be referred to by either of these terms in the following description. Similarly, depending upon the specific current sensing device, the current may be either sensed or measured and the process of determining the current flowing to the load is described in terms of being sensed or measured in the following description.

The present invention contemplates that the calibration current $I_R$ is related to a difference between the source currents sensed, or measured, by the feedback-FET 32 with and without the calibration resistor 40 connected across the loads by a scaling calibration coefficient k. The scaling calibration coefficient k is related to the sensed source currents in accordance with the following relationship:

$$I_R = k(I_{SON} - I_{SOFF}), \text{ where}$$

$I_{SOFF}$ is a first current sensed by the feedback-FET 32 when the calibration FET 42 is in its non-conducting states, and $I_{SON}$ is a second current sensed by the feedback-FET 32 when the calibration FET 42 is in its conducting state.

The above formula may be solved for the scaling calibration factor k as:

$$k = I_R/(I_{SON} - I_{SOFF}) \tag{2}$$

Furthermore, the actual load current $I_L$ is also related to the current $I_{SOFF}$ sensed by the feedback-FET 32 when the calibration FET 42 is in its non-conducting state by the same scaling coefficient k, as shown in the following formula:

$$I_L = k*I_{SOFF}. \tag{3}$$

The above formula may be utilized directly to calculate the value of an actual load current $I_L$. However, upon substituting the scaling factor, as determined by the ratio of $I_R$ to the difference of the second and first sensed currents $(I_{SON} - I_{SOFF})$, as shown by formula (1) above, into the above formula (3), a second, alternate, formula for calculating the actual load current $I_L$ as function of the measured currents results:

$$I_L = [I_R/(I_{SON} - I_{SOFF})]*I_{SOFF}, \tag{4}$$

where $I_R$ is determined from the known resistive value of the precision resistor 40 and the measured power supply voltage V, as shown by formula (1) above, and $I_{SON}$ and $I_{SOFF}$ are the source currents sensed by the feedback-FET 32 when the calibration FET 42 is in its conducting and non-conducting states, respectively.

The present invention contemplates that either of formulas (3) or (4) may be utilized to calculate the value of the actual load current $I_L$.

The present invention also contemplates using this accurate load current to provide a calibration of the current control output signal. The current control is based upon the knowledge that the resistor provides an accurate value for a portion of the current that is flowing in the control circuit and that the accurate current may be used to adjust the operation of the control for changes in the load circuit due to temperature, aging, component replacement or other factors. Thus, the present invention contemplates that a true load impedance $Z_L$ used to determine the control output signal is related to a previously assumed load impedance $Z_{Lprev}$ by a scaling of the accurate calibrated actual load current $I_L$ and the previously sensed load current $I_{SOFF}$ in accordance with the following relationship:

$$Z_{Lprev}*I_{SOFF} = Z_L*I_L, \text{ which may be rewritten as:}$$

$$Z_L = Z_{Lprev}(I_{SOFF}/I_L), \text{ where} \tag{5}$$

$I_{SOFF}$ is the original current sensed by the feedback-FET 32 when the calibration FET 42 is in its non-conducting states, and $I_L$ is the actual load current calculated after the feedback current calibration.

The above formula (5) may be utilized directly to calculate the value of an accurate load impedance $Z_L$. The resulting accurate load impedance value may then used to update the current control output signal of the control system or other control system commands and/or gains. The invention contemplates that the previously assumed load impedance $Z_{Lprev}$ would have been calculated from either component or measured values.

Figure 6:
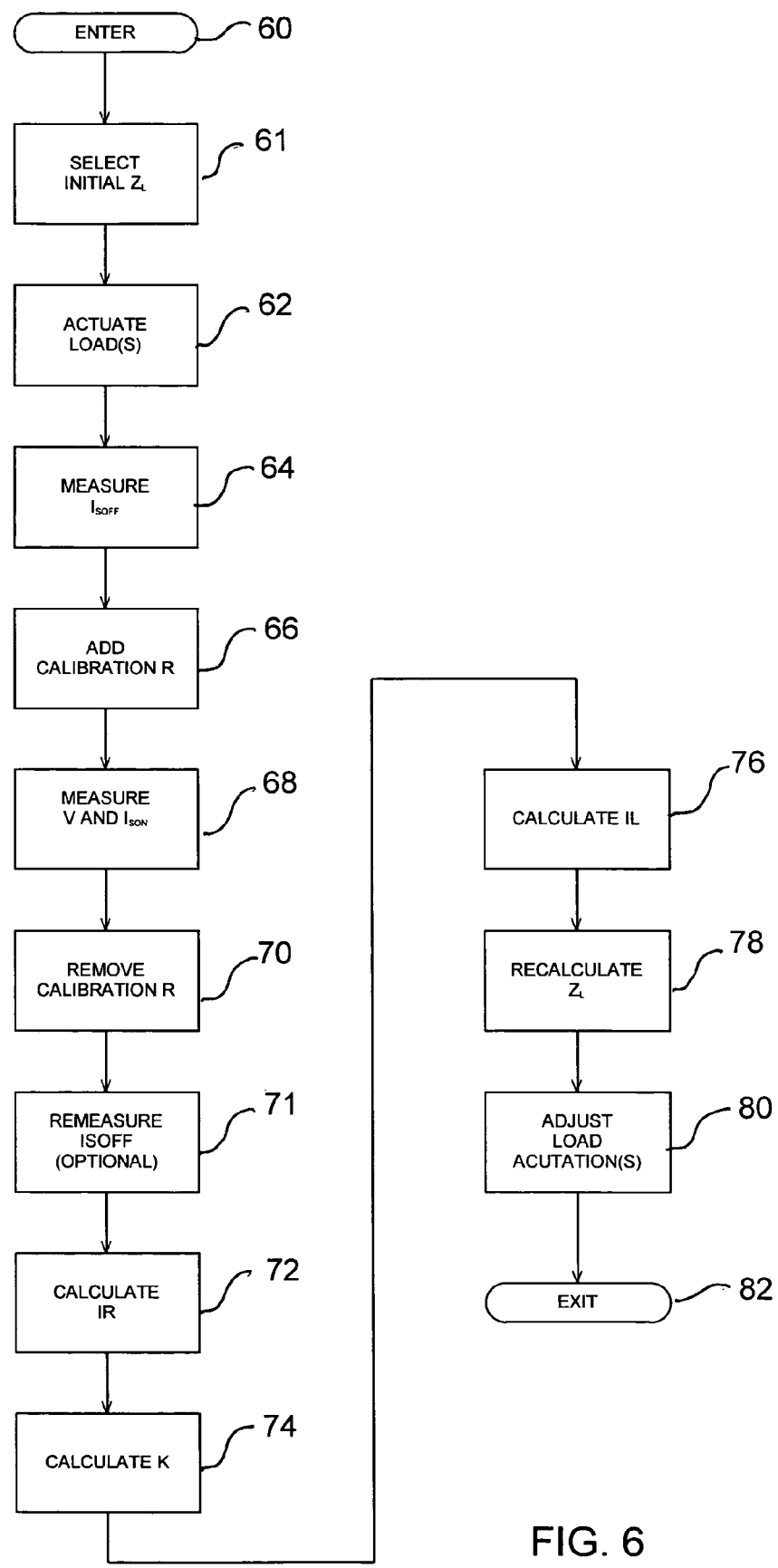
FIG. 6 is flow chart illustrating the operation of the circuit shown in FIG. 5.

The operation of the circuit shown in FIG. 5 is summarized by the flow chart shown in FIG. 6. The flow chart is entered through block 60 where it is assumed that the calibration FET 42 is in a non-conducting state. The algorithm then proceeds to functional block 61 where an initial actuation value for each of the load impedances $Z_1$ through $Z_n$ is assumed. The algorithm continues to functional block 62 where one or more of the driver FET's $T_1$ through $T_n$ are actuated, with the initial actuation based upon the assumed impedance $Z_1$ through $Z_n$ from functional block 61 for each load. The algorithm advances to functional block 64 where the first source current $I_{SOFF}$ is sensed by the feedback-FET 34 and the value provided to the ECU 24. The algorithm continues to functional block 66 where the calibration resistor 40 is connected across the loads by placing the calibration FET 42 into its conducting state. The algorithm then advances to function block 68 where the source voltage V is read by the ECU 24 and the second source current $I_{SON}$ is sensed by the feedback-FET 34 with the value provided to the ECU 24. The algorithm continues to functional block 70 where the calibration resistor 40 is removed from the loads by returning the calibration FET 42 to its non-conducting state. An optional functional block 71 is shown in FIG. 6 in which the source current is again sensed, or measured, after the removal of the calibration resistor 40 and compared to the first source current $I_{SOFF}$ measured in functional block 64. If the difference between the sensed currents exceeds a threshold, it is an indication that a malfunction has occurred, in which case the algorithm is ended and an error flag is set. The algorithm proceeds to functional block 72 where the calibration current $I_R$ is calculated by the ECU 24 from the sensed source voltage and the known resistive value of the calibration resistor 40. The algorithm then advances to functional block 74 where the ECU 24 calculates the calibration coefficient k from the calculated calibration current and the first and second sensed source currents, as described by the formula shown above. The algorithm next enters functional block 76 where the actual load current $I_L$ is calculated by the ECU 24 as the product of the calibration coefficient and first sensed source current $I_{SOFF}$ as shown by formula (1) above. The algorithm next enters functional block 78 where the actual load impedance $Z_L$ is calculated by the ECU 24 as the product of the previously assumed load impedance and the ratio of the assumed source current $I_{SOFF}$ and the actual load current $I_L$ as shown by formula (3) above. The ECU 24 then uses this new impedance value in block 80 to calculate new control outputs to the driver FETs $T_1$ through $T_n$. Finally, the algorithm then exits through block 82.

The present invention also contemplates an alternate embodiment of the algorithm (not shown) in which functional blocks 74 and 76 in FIG. 6 are replaced by one block in which the actual load current $I_L$ is calculated as a function of the calibrating current $I_R$ and the first and second sensed source currents $I_{SOFF}$ and $I_{SON}$, as shown above by the alternate formula (2).

Figure 7:
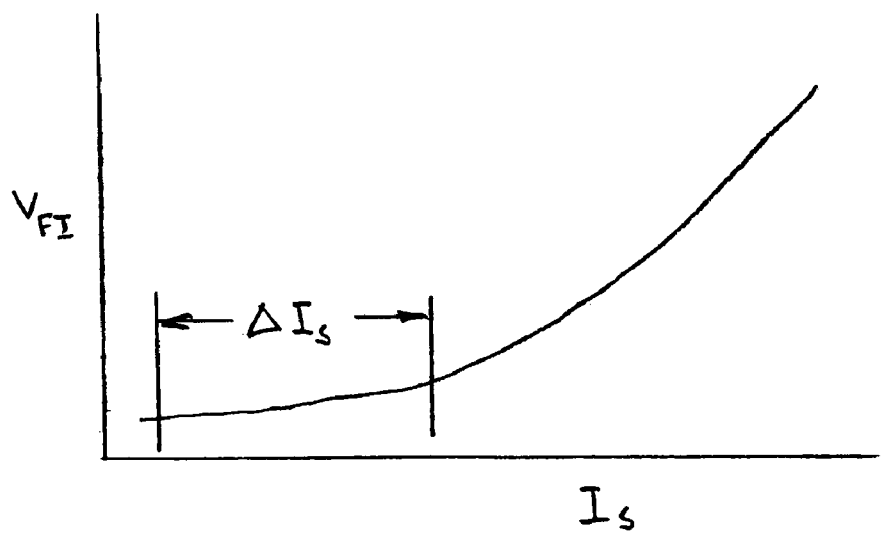
FIG. 7 is a graph illustrating the relationship between a load current and a current feedback signal generated by a feedback-FET.

Thus, the circuit of the present invention provides for calibration of the current values sensed by a feedback-FET when a high degree of accuracy is needed or when the feedback-FET is operating in a region where the feedback voltage is relatively flat with respect to source current, as illustrated by the response curve shown in FIG. 7. In FIG. 7, the voltage $V_{FI}$ supplied by the feedback-FET 32 to the ECU current feedback port 38 is shown as function of the source current $I_S$. In FIG. 7, the region of the curve labeled $\Delta I_S$ is relatively flat. Accordingly, a large change in source current within the region $\Delta I_S$ will cause a small change in the value of $V_{FI}$, potentially resulting in inaccurate current readings. However, application of the present invention enhances the accuracy of the current feedback readings when the source current is within the region $\Delta I_S$. Ultimately this allows the use of a less expensive but also less accurate device in the high-current path while maintaining precision feedback via low current devices. Additionally, as described above, the circuit of the present invention also provides for calibration of the assumed impedance value(s) of the load(s) when an external factor (temperature, aging, component replacement or other factors) causes a change in the load characteristics.

The present invention contemplates that the calibration of the source current by calculation of the scaling constant k may be done either once per operating cycle or periodically during the cycle. The later operation of the self calibration circuit would be useful in applications where the control FET's $T_1$ through $T_n$ are be switched on and off periodically by applying a pulse modulated voltage to their gates. The invention contemplates that, by properly designing the switching speed of the calibration FET 42, the value of k may be optionally determined each time one of the control FET's is placed into its conducting state. Alternately, the value of k may be determined less frequently and applied to the sensed currents between updates of the value.

As indicated above, if only one of the loads $L_1$ through $L_n$ is excited at a time, the load current $I_L$ is equivalent to the coil current. Similarly, if several of the loads are excited at the same time, the first and second source currents are equivalent to the sum of currents flowing through the excited loads and relationships described above remain in effect.

Figure 8:
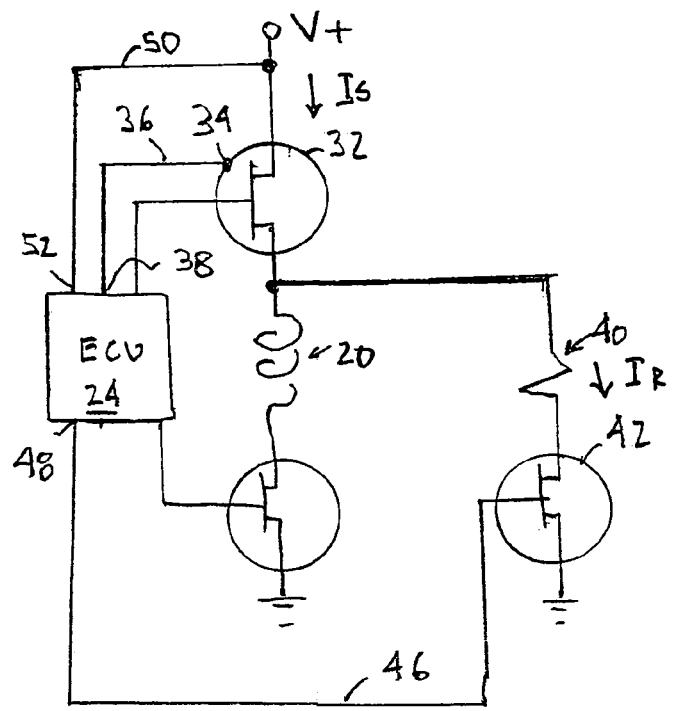
FIG. 8 is a schematic diagram of an alternate embodiment of the circuit shown in FIG. 5.

The present invention also may be applied to a circuit with a single load 20, as illustrated in FIG. 8, where components that are similar to components shown in the preceding figures have the same numerical designators. As shown in FIG. 8, the calibrating resistor 40 is connected across the load 20 which is controlled by the single driver FET 60. Again, the formulas presented above also apply to FIG. 8 with the actual load current $I_L$ being the current passing through the single load 20.

Figure 9:
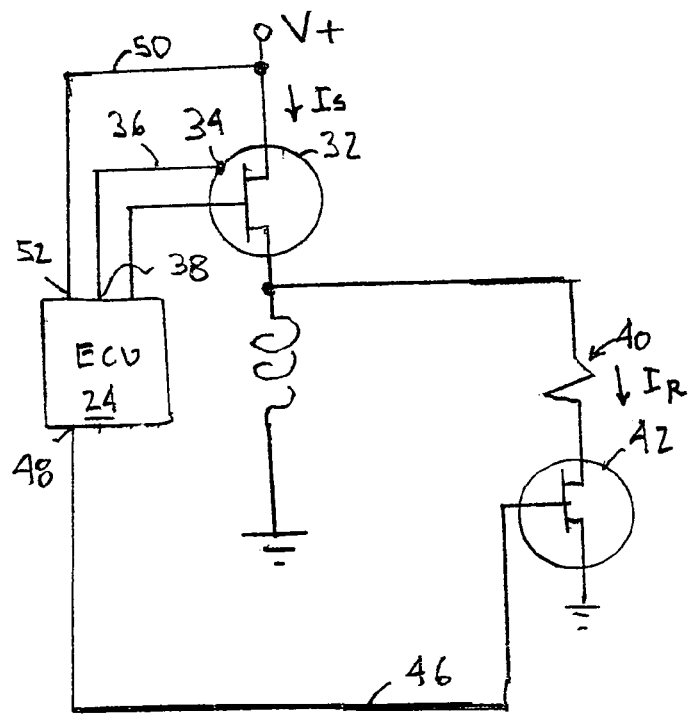
FIG. 9 is a schematic diagram of another alternate embodiment of the circuit shown in FIG. 5.

An alternate embodiment of the invention is shown in FIG. 9 where again components that are similar to components shown in the preceding figures have the same numerical identifiers. As shown in FIG. 9, the feedback-FET 32 is also the driver FET for the single load 20 which now has its low side connected directly to ground. Thus, the load driver FET 60 shown in FIG. 8 is eliminated. Where a grounded load circuit configuration such as shown in FIG. 9 is acceptable, the cost of the circuit may be reduced by elimination of the control FET 60 while preserving the self-calibration feature.

While the preferred embodiments have been illustrated and described as calibrating a measured current that is flowing through a coil, it will be appreciated that the invention also may be practice to calibrate currents flowing through other loads. Additionally, as mentioned above, other current sensing devices, such as shunts or semi-conductor components other than FET's, may be utilized to sense the load currents $I_{SOFF}$ and $I_{SON}$; however, the present invention also may utilized with such devices. Additionally, the invention may be practiced on circuits that include other switching devices, such as transistors, semi-conductor devices and mechanical switches in place of the driver FET's $T_1$ through $T_n$ that are described and illustrated above.

The inventors believe that the invention may be utilized in a wide variety of applications, such as, for example, control the application of hydraulic pressure in a vehicle electronic brake system, such as an Anti-Lock Brake System, a Traction Control System and/or a Vehicle Stability Control System. Other applications may include control of multiple fuel injectors in an engine control system and control of solenoid valves in active suspension systems and electrically assisted power steering systems. The invention may also be practiced with non-vehicle applications such as control of motors, temperature sensitive loads, and any type of load, in which conductivity/impedance is not accurately predictable and that needs a predefined amount of current for both fixed and variable operation.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A self calibrating control circuit comprising:
   a load;
   a current sensing device connected in series with said load;
   a high precision load device that includes a precision resistor, said high precision load device having known characteristics, said high precision load device being selectively connected across said load; and
   a calibration device connected to said current sensing device and said high precision load device, said calibration device monitoring an output voltage of a power supply electrically connected to said load and measuring a first load current flowing through said load without said high precision load device connected across said load, subsequent to measuring said first load current, said calibration device connects said high precision load device across said load and measures a second load current flowing through said load, said calibration device then determines a calibration current by dividing said power supply voltage by the resistive value of said precision resistor and an actual load current by the following formula:

$I_L = [I_R/(I_{SON} - I_{SOFF})] * I_{SOFF}$, where $I_L$ is said actual load current;
   $I_R$ is said calibration current; and
   $I_{SON}$ and $I_{SOFF}$ are said second and first load currents, respectively.

2. A self calibrating control circuit comprising:
   a load;
   a current sensing device connected in series with said load;
   a high precision load device that includes a precision resistor, said high precision load device having known characteristics, said high precision load device being selectively connected across said load; and
   a calibration device connected to said current sensing device and said high precision load device, said calibration device monitoring an output voltage of a power supply electrically connected to said load and measuring a first load current flowing through said load without said high precision load device connected across said load, subsequent to measuring said first load current, said calibration device connects said high precision load device across said load and measures a second load current flowing through said load and also determines a true load impedance by scaling an assumed load impedance by a ratio of said first load current to said actual load current.

3. The circuit according to claim 2 wherein said calibration device also determines at least one modified control command in a control system as a function of said true load impedance and further wherein said calibration device then replaces a corresponding control command in said control system with said modified control command.

4. A self calibrating control circuit comprising:
   a load;
   a current sensing device connected in series with said load;
   a high precision load device that includes a precision resistor, said high precision load device having known characteristics, said high precision load device being selectively connected across said load; and
   a calibration device connected to said current sensing device and said high precision load device, said calibration device monitoring an output voltage of a power supply electrically connected to said load and measuring a first load current flowing through said load without said high precision load device connected across said load, subsequent to measuring said first load current, said calibration device connects said high precision load device across said load and measures a second load current flowing through said load, said calibration device then determines a difference between said first and second load currents and a calibration coefficient as a function of said difference between said first and second load currents and utilizes said calibration coefficient to determine an actual load current as the product of said calibration coefficient and said first load current.

5. The circuit according to claim 4 wherein said calibration coefficient is determined by the following formula:

$k = I_R/(I_{SON} - I_{SOFF})$, where k is said calibration coefficient;
   $I_R$ is a calibration current that is determined by dividing said power supply voltage by the resistive value of said precision resistor; and
   $I_{SOFF}$ is said first load current; and
   $I_{SON}$ is said second load current.

6. The circuit according to claim 5 wherein current sensing device is an enhanced Field Effect Transistor that includes a current sensing capability, said enhanced Field Effect Transistor being connected to said load with said current sensing capability being operative to measure said first and second load currents.

7. The circuit according to claim 6 wherein said high precision load device also includes a Field Effect Transistor connected to said precision resistor, said Field Effect Transistor being switched between non-conducting and conducting states to connect said precision resistor across said load.

8. The circuit according to claim 7 wherein said calibration device includes a microprocessor having a memory and further wherein said memory stores an algorithm for monitoring said measured currents and determining said actual load current.

9. The circuit according to claim 8 wherein said microprocessor is included in an Electronic Control Module for a vehicle control system.

10. The circuit according to claim 9 wherein said vehicle control system is an electronic brake control system.

11. A method for calibrating a current flowing through a load comprising the steps of:
    (a) providing a high precision load device that includes a high precision resistor having a known resistance and that may be selectively connected across the load;
    (b) measuring a first current through the load without the high precision load device connected across the load;
    (c) connecting the high precision load device across the load;
    (d) measuring a power supply voltage;
    (e) dividing the measured power supply voltage by the known resistance to determine an expected calibration current;
    (f) measuring a second current through the load with the high precision load device connected across the load;
    (g) determining a calibration coefficient as a function of the expected calibration current and the first and second load current measurements: and
    (h) determining an actual load current as the product of the calibration coefficient and the first load current measurement.

12. The method of claim 11 wherein the calibration coefficient is determined in step (g) by the following formula:

$$k = I_R/(I_{SON} - I_{SOFF}), \text{ where}$$

k is the calibration coefficient;
$I_R$ is the expected calibration current; and
$I_{SOFF}$ is the first load current; and
$I_{SON}$ is the second load current.

13. A method for calibrating a current flowing through a load comprising the steps of:
   (a) providing a high precision load device that includes a high precision resistor having a known resistance and that may be selectively connected across the load;
   (b) measuring a first current through the load without the high precision load device connected across the load;
   (c) connecting the high precision load device across the load;
   (d) measuring a power supply voltage;
   (e) dividing the measured power supply voltage by the known resistance to determine an expected calibration current;
   (f) measuring a second current through the load with the high precision load device connected across the load; and
   (g) determining an actual load current by the following formula:

$$I_L = [I_R/(I_{SON} - I_{SOFF})]*I_{SOFF}, \text{ where}$$

$I_R$ is the expected calibration current; and
$I_{SON}$ and $I_{SOFF}$ are the second and first load currents, respectively.

14. The method of claim 13 wherein the high precision load device provided in step (a) also includes an electronic switch that is connected to the precision resistor and further wherein, during step (c), the electronic switch is placed into its conducting state to connect the precision resistor across the load.

15. The method of claim 14 wherein an enhanced Field Effect Transistor that includes a current sensing capability is connected to the load and, during steps (b) and (f), the enhanced Field Effect Transistor measures the first and second load currents, respectively.

16. A method for calibrating a current flowing through a load comprising the steps of:
   (a) providing a high precision load device that may be selectively connected across the load;
   (b) measuring a first current through the load without the high precision load device connected across the load;
   (c) connecting the high precision load device across the load;
   (d) determining an expected calibration current flowing through the high precision load device;
   (e) measuring a second current through the load with the high precision load device connected across the load;
   (f) determining an actual load current as a function of the first and second load currents and the expected calibration current; and
   (g) determining a true load impedance by scaling an assumed load impedance by a ratio of the first load current to the actual load current.

17. The method of claim 16 further including the steps of:
   (h) determining at least one modified control command in a control system as a function of the true load impedance determined in step (g); and
   (i) replacing a corresponding control command in the control system with the modified control command determined in step (h).

* * * * *